(12) United States Patent
Billingsley et al.

(10) Patent No.: US 9,166,396 B2
(45) Date of Patent: *Oct. 20, 2015

(54) POWER CONDITIONING, DISTRIBUTION AND MANAGEMENT

(71) Applicant: Electronic Systems Protection, Inc., Knightdale, NC (US)

(72) Inventors: Richard J. Billingsley, Rossland, CA (US); Robert A. Dawley, Clayton, NC (US)

(73) Assignee: Electronic Systems Protection, Inc., Knightdale, NC (US)

( * ) Notice: Subject to any disclaimer, the term of this patent is extended or adjusted under 35 U.S.C. 154(b) by 240 days.

This patent is subject to a terminal disclaimer.

(21) Appl. No.: 13/905,751

(22) Filed: May 30, 2013

(65) Prior Publication Data
US 2013/0258538 A1 Oct. 3, 2013

Related U.S. Application Data

(63) Continuation-in-part of application No. 13/198,137, filed on Aug. 4, 2011, now Pat. No. 8,520,349.

(60) Provisional application No. 61/438,022, filed on Jan. 31, 2011.

(51) Int. Cl.
*H02H 3/20* (2006.01)
*G01R 19/165* (2006.01)
(Continued)

(52) U.S. Cl.
CPC ......... *H02H 3/207* (2013.01); *G01R 19/16547* (2013.01); *G01R 19/16576* (2013.01); *H01H 9/542* (2013.01); *H01H 9/56* (2013.01); *H02H 3/06* (2013.01)

(58) Field of Classification Search
CPC ......... H02H 3/06; H02H 3/207; H01H 9/542; H01H 9/56; G01R 19/16547; G01R 19/16576
USPC ........................................................ 361/91.1
See application file for complete search history.

(56) References Cited

U.S. PATENT DOCUMENTS 4,206,443 A 6/1980 Britton
4,414,601 A 11/1983 Conroy, Jr.
(Continued)

FOREIGN PATENT DOCUMENTS

EP 2071701 6/2009
EP 2325988 5/2011
(Continued)

OTHER PUBLICATIONS

European Search Report in counterpart European Application No. 14001831.8, mailed Sep. Oct. 13, 2014.

*Primary Examiner* — Thienvu Tran
*Assistant Examiner* — Kevin J Comber
(74) *Attorney, Agent, or Firm* — Edell, Shapiro & Finnan LLC (57) ABSTRACT

A power conditioning, distribution and management system includes a switch circuit that enables coupling of an AC power supply to a load though an overcurrent device. A control circuit switches the switch circuit from a non-conductive state to a conductive state when a supply voltage signal is between first overvoltage and undervoltage thresholds. The control circuit records an overvoltage event and maintains the switch circuit in the conductive state when the supply voltage signal exceeds a second, higher overvoltage threshold and switches the switch circuit to a nonconductive state when the supply voltage signal exceeds a third, highest overvoltage threshold. The control circuit records an undervoltage event and maintains the switch circuit in the conductive state when the supply voltage signal falls below a second, lower under-voltage threshold and switches the switch circuit to the non-conductive state when the supply voltage signal falls below a third, lowest undervoltage threshold.

20 Claims, 7 Drawing Sheets

(51) Int. Cl.
*H01H 9/54* (2006.01)
*H01H 9/56* (2006.01)
*H02H 3/06* (2006.01)

(56) References Cited

U.S. PATENT DOCUMENTS

| | | | |
|---|---|---|---|
| 5,136,455 A | 8/1992 | Billingsley | |
| 5,440,441 A | 8/1995 | Ahuja | |
| 5,721,661 A | 2/1998 | Mechanic | |
| 5,956,222 A | 9/1999 | Wittner et al. | |
| 5,982,596 A | 11/1999 | Spencer et al. | |
| 6,040,969 A | 3/2000 | Winch et al. | |
| 6,118,639 A | 9/2000 | Goldstein | |
| 6,229,682 B1 | 5/2001 | Mechanic | |
| 6,560,096 B1 | 5/2003 | Lopez | |
| 6,728,089 B2 | 4/2004 | Harford | |
| 6,744,613 B2 | 6/2004 | McCook et al. | |
| 6,947,266 B1 | 9/2005 | Billingsley | |
| 6,956,725 B2 | 10/2005 | Boughton, Jr. et al. | |
| 7,068,487 B2 | 6/2006 | Harford | |
| RE39,446 E | 12/2006 | Winch et al. | |
| 7,184,252 B2 | 2/2007 | Harford | |
| 7,511,934 B2 | 3/2009 | Benton et al. | |
| 7,541,696 B2 | 6/2009 | Dawley | |
| 7,551,412 B2 | 6/2009 | Winch | |
| 7,568,117 B1 * | 7/2009 | Fernald | 713/340 |
| 2007/0194942 A1 | 8/2007 | Darr | |
| 2008/0019068 A1 | 1/2008 | Reynolds et al. | |
| 2008/0247105 A1 * | 10/2008 | Divan | 361/56 |
| 2008/0258709 A1 | 10/2008 | Shuey | |
| 2009/0116158 A1 | 5/2009 | Graves et al. | |
| 2010/0067158 A1 | 3/2010 | Saarinen | |
| 2011/0063759 A1 | 3/2011 | Billingsley et al. | |
| 2011/0313583 A1 | 12/2011 | Lin | |
| 2012/0221161 A1 | 8/2012 | Billingsley et al. | |

FOREIGN PATENT DOCUMENTS

| | | |
|---|---|---|
| EP | 2482085 A1 | 8/2012 |
| EP | 2555004 A1 | 2/2013 |
| WO | 2007143576 | 12/2007 |
| WO | 2009082484 | 7/2009 |

* cited by examiner

POWER CONDITIONING, DISTRIBUTION AND MANAGEMENT

CROSS REFERENCE TO RELATED APPLICATION

This application claims priority under 35 U.S.C. §119(e) from and is a continuation-in-part application of U.S. patent application Ser. No. 13/198,137 entitled "Supply Voltage Monitor," filed Aug. 4, 2011, which claims priority under 35 U.S.C. §119(e) from U.S. Provisional Patent Application No. 61/438,022 entitled "Supply Voltage Monitor," filed Jan. 31, 2011. The disclosures of both of the forgoing applications are incorporated herein by reference in their respective entireties.

BACKGROUND

Power distribution units (PDUs) provide power from an alternating current (AC) power source to one or more loads connected thereto. PDUs typically include circuitry that disconnects the AC power from the connected loads in response to overcurrent conditions. A ubiquitous example of such circuitry is a circuit breaker that opens when current drawn by an electrical load and passing through the circuit breaker exceeds a rated current. Typical circuit breakers are current controlled devices and are not responsive to voltage anomalies, such as voltage surges. Thus, load equipment connected to a PDU having such overcurrent protection may be left vulnerable to potentially damaging anomalies in the AC source power. Additionally, certain line voltage conditions, such as swells and overvoltages, can cause failure of certain components in the power protection device itself, such as metal oxide varistors and other suppressor components. Given the range of different undesirable, damaging and in certain cases dangerous power conditions and the many points of potential failure at which such power conditions can adversely operate, ongoing development efforts seek ever more robust power protection solutions to an ever-widening set of power-related problems.

SUMMARY

Described herein is a power conditioning, distribution and management system (PCDMS) and concomitant method for providing conditioned power to connected load equipment based on supply or input voltage characteristics as well as load or output current characteristics. A switch circuit selectively couples input circuitry connectable to an AC power supply to output circuitry connectable to a load through an overcurrent protection device. The switch circuit is controllable into a conductive state, where an input conductor coupling the input circuitry to the switch circuit is electrically connected through the switch circuit to an output conductor coupling the output circuitry to the switch circuit. The switch is also controllable into a non-conductive state, where the input conductor is electrically disconnected from the output conductor by the switch circuit. A supply signal sampling circuit generates a supply voltage sample signal representative of a voltage of the AC power supply. A control circuit monitors the supply voltage sample signal and compels the switch circuit into the conductive state in response to the supply voltage signal being below a first overvoltage threshold and above a first undervoltage threshold while the switch circuit is in the non-conductive state. When the supply voltage sample signal exceeds a second overvoltage threshold that is higher than the first overvoltage threshold while the switch circuit is in the conductive state, the control circuit records an indication of an occurrence of an overvoltage event, but may compel the switch circuit to remain in the conductive state. In response to the supply voltage signal exceeding a third overvoltage threshold that is higher than the second overvoltage threshold while the switch circuit is in the conductive state, the control circuit compels the switch circuit into the non-conductive state. Similarly for an undervoltage condition in certain embodiments, when the supply voltage sample signal falls below a second undervoltage threshold that is lower than the first undervoltage threshold while the switch circuit is in the conductive state, the control circuit may record an indication of an occurrence of an undervoltage event, but may compel the switch circuit to remain in the conductive state. In response to the supply voltage signal falling below a third undervoltage threshold that is lower than the second undervoltage threshold while the switch circuit is in the conductive state, the control circuit may compel the switch circuit into the non-conductive state.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

The figures described herein include schematic block diagrams illustrating various functional modules for purposes of description and explanation. Such diagrams are not intended to serve as electrical schematics and interconnections illustrated are merely to depict signal flow, various interoperations between functional components and/or processes and are not necessarily direct electrical connections between such components. Moreover, the functionality illustrated and described via separate components need not be distributed as shown, and the discrete blocks in the diagrams are not necessarily intended to depict discrete electrical components.

The power conditioning, distribution and management technique described herein employs a plurality of voltage threshold levels against which monitored voltage of an AC supply is compared. In response to the AC supply crossing a threshold, a corresponding action is taken. For example, if an AC supply voltage exceeds a record overvoltage threshold, the event is recorded and can be reviewed and evaluated either in real time or at some later point in time to determine if a problem condition has developed. If the AC supply voltage exceeds a higher cutoff overvoltage threshold, the connected load equipment is disconnected from the AC supply. Similarly, if the AC supply voltage falls below a record undervoltage threshold, the event is recorded, and if the AC supply voltage falls below a lower cutoff undervoltage threshold, the equipment is disconnected from the AC supply. In this manner, the load equipment and the monitoring device are immediately protected from potentially damaging overvoltage and undervoltage conditions, while less severe overvoltage and undervoltage conditions will not cause an immediate power disruption, but can be reported. Accordingly, if persistent, lower-level undervoltage and overvoltage conditions are observed by way of such reporting, corrective measures can be taken at a convenient time.

Figure 1:
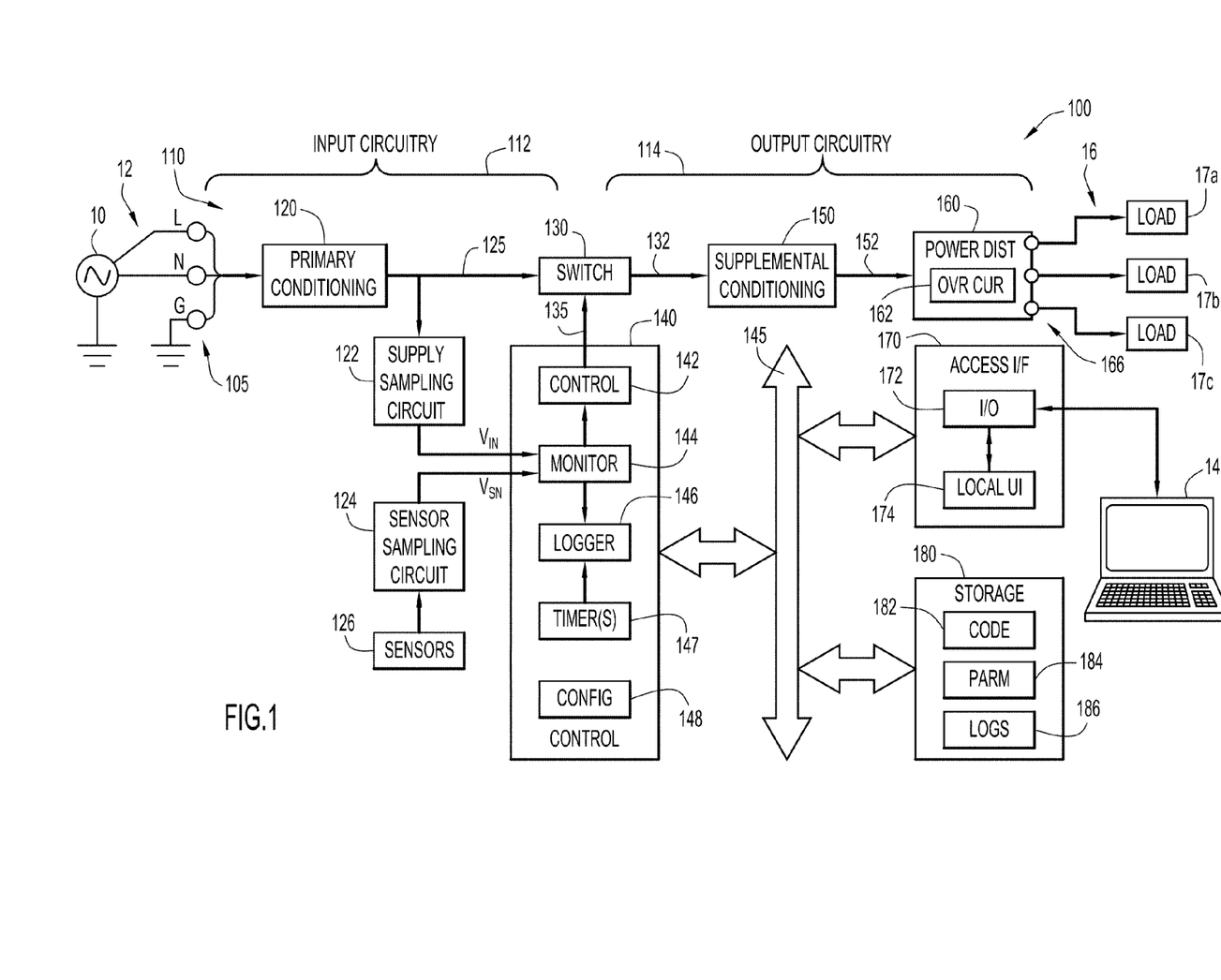
FIG. 1 is a schematic block diagram of an embodiment of a power conditioning, distribution and management system (PCDMS) capable of selectively connecting an AC power supply to load equipment.

FIG. 1 is a schematic block diagram of an exemplary power conditioning, distribution and management system (PCDMS) 100 by which the present invention can be embodied. PCDMS 100 may be connected to a power source 10 by way of a set of input terminals 105 and to one or more electrical loads 17a-17c, representatively referred to herein as load(s) 17, by way of a set of output terminals 166. Electrical power is provided from power source 10 to loads 17 over a power provision path 110 comprising input circuitry 112 and output circuitry 114 that are selectively connected and disconnected through a switch circuit 130. In typical AC applications, terminals 105 and 166 will include one or more line terminals, representatively illustrated at L, each having an AC voltage that may be offset in phase relative to the others, a neutral conductor N and a ground conductor G. Input terminals 105 and output terminals 166 may be implemented by suitable electrical connectors, such as those compliant with National Electrical Manufacturers Association (NEMA) or International Electro-technical Commission (IEC) standards. Supply voltage, generally illustrated at 12, from power source 10 may be provided to a primary conditioning circuit 120, by which the input voltage is conditioned, e.g., by filtration of normal and common mode electromagnetic interference (EMI) and by suppression of normal and common mode voltage transients. To that end, primary conditioning circuit 120 may include filter circuits, e.g., shunt capacitors, to reduce differential mode EMI noise and filter circuits that impose high series impedance in the line conductor, e.g. inductors, to reduce common mode EMI noise. Additionally, primary conditioning circuit 120 may be constructed to divert energy contained in potentially damaging voltage transients away from circuitry beyond the diversion point, which may be beneficially located at the input of primary conditioning circuit 120. Primary conditioning circuit 120 may also include circuit elements, e.g., voltage limiters that suppress lower energy overvoltage in the supply voltage.

Conditioned input voltage from primary conditioning circuit 120 is provided to supplemental voltage conditioning circuit 150 through switch circuit 130, which will be described in paragraphs that follow. Supplemental conditioning circuit 150 extends the conditioning of primary conditioning circuit 120. For example, supplemental conditioning circuit 150 may include filter circuits similar to those used in primary conditioning circuit 120, e.g., shunt capacitors, to reduce differential mode EMI noise. In addition, supplemental conditioning circuit 150 may include elements, e.g., shunt capacitors that shunt common mode EMI noise currents carried in both line and neutral conductors to ground. Supplemental condition circuit 150 may include voltage limiting elements that limit the output voltage to some maximum value. In certain embodiments, the voltage limiting elements in supplemental conditioning circuit 150 activate at a threshold voltage that is less than the threshold voltage of the voltage limiting elements in primary conditioning circuit 120, should primary conditioning circuit include such elements at all.

Conditioned output voltage emerges from supplemental conditioning circuit 150 and may be provided to output power distribution circuit 160, where it is distributed across output terminal(s) 166. Power distribution circuit 160 may include one or more overcurrent protection devices (OVR CUR) 162 that are configured to open upon an overcurrent condition through a corresponding output terminal 166. The present invention is not limited to particular overcurrent protection mechanisms and configurations; individual overcurrent protection devices 162 may be connected to individual respective terminals 166 or may be connected to respective banks of output terminals 166. Overcurrent protection devices 162 may be implemented by suitable circuit breakers, for example, that open at fixed or user-programmable current levels. When so embodied, power can only be delivered from power source 10 to loads 17 when 1) switch circuit 130 is in its conductive state and 2) when the overcurrent protection device 162 series-connected to the terminal 166 to which the particular load 17 is connected is also in its conducting state.

Switch circuit 130 may be electrically interposed between primary conditioning circuit 120 and supplemental conditioning circuit 150 to selectively couple and decouple input circuitry 112 and output circuitry 114 in accordance with a switch control signal 135. In a conductive state, switch circuit 130 electrically connects, for example, input line conductor 125 to output line conductor 132 and, in a non-conductive state, input line conductor 125 and output line conductor 132 are electrically disconnected by switch circuit 130. It is to be understood that, while a single switch circuit 130 is illustrated and described in FIG. 1, the present invention can be embodied with multiple switch circuits, each inserted at appropriate points in power provisioning path 110, i.e., in any line conductor and/or in the neutral conductor, to achieve a designed protection goal.

Switch circuit 130 can be implemented using any of a wide variety of switching mechanisms. According to one option, switch circuit 130 can comprise an electromagnetic relay (EMR) that is operable into an open or closed state in accordance with an applied relay coil voltage. According to another option, switch circuit 130 can be implemented with a power semiconductor, such as a triac, that is operable into a conducting or non-conducting state in accordance with an applied gate voltage. In yet another option, switch circuit 130 can be implemented by a hybrid switch circuit using a combination of a power semiconductor and an electromagnetic relay electrically connected in parallel, such as that described in U.S. Patent Application Publication No. 2011/0063759, the disclosure of which is hereby incorporated by reference in its entirety. Switch circuit 130 may be compelled into a non-conducting state in response to overvoltage and undervoltage conditions to protect thereby connected loads 17 and vulnerable downstream components of PCDMS 100 (e.g., metal oxide varistors (MOVs) and other suppressor components) from damage.

A supply voltage sampling circuit 122 may be coupled to input conductors of PCDMS 100. Supply voltage sampling circuit 122 generates a supply voltage sample signal $V_{IN}$ from the AC supply voltage that is indicative of time-varying characteristics of the input voltage in a manner suitable for processing by a control circuit 140. Supply voltage sample signal $V_{IN}$ is generated in a form that is compatible with the architecture of control circuit 140. For example, if control circuit 140 is implemented by a microcontroller that accepts AC voltage signal input, supply voltage sampling circuit 122 may generate supply voltage sample signal $V_{IN}$ as a stepped-down copy of the AC supply voltage. If control circuit 140 is implemented by a microcontroller that accepts DC voltage signal input, supply voltage sampling circuit 122 may generate supply voltage sample signal $V_{IN}$ as an analog DC voltage signal having a DC voltage that is proportional to the AC supply voltage. Supply voltage sample signal $V_{IN}$ may also be generated as a digital number indicative of the AC input voltage, such as by analog-to-digital conversion of the analog DC voltage signal just described. Supply voltage sampling circuit 122 may generate supply voltage sample signal $V_{IN}$ continuously or only at prescribed intervals, but the AC input voltage is said to be measured herein at a particular sample time, which may correspond to the time at which supply voltage sample signal $V_{IN}$ is analyzed to determine whether any action is to be taken. For example, in the event that the supply voltage, as represented by $V_{IN}$, does not meet one or more predetermined criteria, control circuit 140 may compel switch 130 into a non-conductive state to prevent the non-compliant voltage from being applied to circuitry beyond that point. This and other actions taken by control circuit 140 in various power quality scenarios are described in detail below.

It is to be understood that the supply voltage sample signal $V_{IN}$ may represent the supply line-to-neutral voltage or, in other options, a signal representative of the line-to-ground voltage may be generated.

In certain embodiments, PCDMS 100 may include one or more sensors, representatively illustrated at sensor block 126, for purposes of obtaining additional information. The present invention is limited neither to a particular sensor set nor to a particular use for any data produced thereby. In typical applications, sensors 126 may include one or more temperature sensors, which may be used to monitor the ambient temperature about PCDMS 100 and/or within an enclosure that may house the system components of PCDMS 100. However, it is to be understood that other sensors may be incorporated in sensor set 126, such as to measure humidity, light levels, vibration, etc., as well as voltage and current to supplement the voltage monitoring of the supply input voltage. The signals generated by respective sensors 126 may be provided to sensor sampling circuit 124, which, in a manner similar to that described with reference to supply voltage sampling circuit 122, generates one or more sensor sample signals $V_{SN}$. When so embodied, information conveyed by sensor sample signal(s) $V_{SN}$ can be used to make power control decisions in addition to the information conveyed by supply voltage sample signal $V_{IN}$ as the skilled artisan will understand and appreciate upon review of this disclosure.

Control circuit 140 implements the control functionality of PCDMS 100 including, but not limited to, monitoring the supply input voltage for quality, controlling the transfer of electrical energy in power provisioning path 110 based on the monitored quality of the supply input voltage, recording selected data including data that are descriptive of power quality events and affording access to various internal functions by which users can configure, monitor, and operate PCDMS 100. Control circuit 140 may be realized in analog and/or digital circuitry including analog-to-digital converters (ADCs), digital-to-analog converters (DACs), fixed and programmable digital logic circuits including programmable gate arrays, application specific integrated circuits (ASICs), microcontrollers, microprocessors, digital signal processors and other circuitry as needed. Control circuit 140 may include a processor capable of executing suitably programmed processor instructions for carrying out various operations and tasks, e.g., interpret and/or translate received data and commands, perform computations, cause information to be stored, etc. By such circuitry and/or processor instructions, control circuit 140 may realize a power controller 142 by which switch control signal 135 is generated to operate switch circuit 130 into various states, a monitor 144 by which the AC supply voltage and optional sensor data are monitored against established criteria, a configurator 148 by which operational parameters, e.g., supply voltage thresholds, etc., for PCDMS 100 may be established and/or modified, one or more timers 147 and a data logger 146 by which system and operational data are generated and recorded.

PCDMS 100 may include an access interface circuit 170 communicatively coupled with control circuit 140, such as through a suitably constructed data and control bus 145, through which certain data can be accessed and certain operations performed. Access interface circuit 170 may incorporate an input/output (I/O) circuit that implements various signaling and communications ports through which a user can interact with PCMDS 100. The present invention is not limited to particular I/O circuits, interface conventions, signaling or communication protocols, etc. In certain embodiments, at least one such port is configured for access by suitable terminal equipment, representatively illustrated by terminal 14, such as by a serial port for use by a simple data terminal or computer, or by a telecommunications network interface port, wireless or wired, by which such access may be achieved over a network, such as a local area network (LAN) or the Internet, to name a few. Access interface 170 may also include a local user interface (UI) 174 such as on an exterior panel of an enclosure in which PCDMS 100 is housed. Local UI 174 may incorporate one or more human interface devices (HIDs) including a display that can be any of a variety of display mechanisms (e.g., an LCD display, an LED display, etc.) that produce a visual indication of information. Local UI 174 may include other HIDs including buttons, cursor control devices, etc. through which a user can interact with and operate PCDMS 100.

Control circuit 140 may be communicatively coupled to storage system 180, such as through data and control bus 145, in which varied information is stored on behalf of PCDMS 100. Such information may be in the form of processor instructions, representatively illustrated by code storage location 182, which, when executed by a processor that may be a part of control circuit 140, causes such processor to implement the functionality described herein. Storage system 180 may also store operating parameters, representatively illustrated at parameter storage location 184, under which operation of PCDMS 100 is controlled or regulated at any given time. Such operating parameters may be set and changed by an operator, such as through access interface 170 and configurator 148. Storage circuit 180 may also store logs, representatively illustrated by log storage location 186, including event logs, data logs, troubleshooting logs, etc. Storage 180 may include a non-transitory computer readable medium on which processor instructions (i.e., software) are encoded or otherwise stored and from which such processor instructions can be retrieved and executed on a processor or processors of control circuit 140. As used herein, the term "computer readable medium" refers to non-transitory (tangible) media (e.g., memory or storage devices). Storage 180 may include non-volatile memory circuits, such as EEPROM, flash memory or a hard disk drive, configured to store event information, as will be described below.

Timers 147 may include a real-time clock circuit configured to track time (e.g., seconds, minutes, hours, and days, etc.) for purposes of timestamping data with calendar time. Timers 147 may also be configured to indicate elapsed time, such as from the occurrence of the most recent event. Additionally, timers 147 may include one or more system timers by which various temporally dependent operations can be executed. For example, one operation may require a certain amount of time to lapse as measured from a previous operation before it can execute, and a timer 147 can be configured appropriately to indicate when such time has lapsed.

According to an example implementation, supply voltage sample signal $V_{IN}$ is an analog DC signal proportional to the potential difference between the line and neutral conductors carrying the conditioned input voltage 125. Timers 147 may be configured to indicate a sampling interval in accordance with which control circuit 140 periodically performs an analog-to-digital (A/D) conversion on the supply voltage sample signal $V_{IN}$ to generate a digital signal that is directly proportional to the supply voltage. The digital signal can then be analyzed by various digital computation and analysis techniques to ascertain characteristics of interest of the supply voltage. In one analysis, the digital representation of $V_{IN}$ is compared to various voltage level thresholds to determine whether the supply voltage meets acceptability criteria. If such is not the case, such as when an undervoltage (UV) or overvoltage (OV) exists to a specified level, a power quality event is said to occur and control circuit 140 executes a particular action based on what power quality event occurred.

Operation of control circuit 140 in relation to an example set of thresholds is described in connection with the graph of FIG. 2, which depicts exemplary operation of monitor 144 with respect to supply voltage sample signal $V_{IN}$ and various threshold levels, and in connection with the state diagram of FIG. 3, which depicts the transitions between operational states of a state machine implementation of power controller 142 in response to various power quality events. In the following example, it is to be assumed that an event occurs when a corresponding threshold is crossed. However, it is to be understood that the invention is not limited to any particular determination of threshold criteria being met, i.e., whether a threshold criterion is met by crossing the threshold or by being equal to the threshold.

Figure 2:
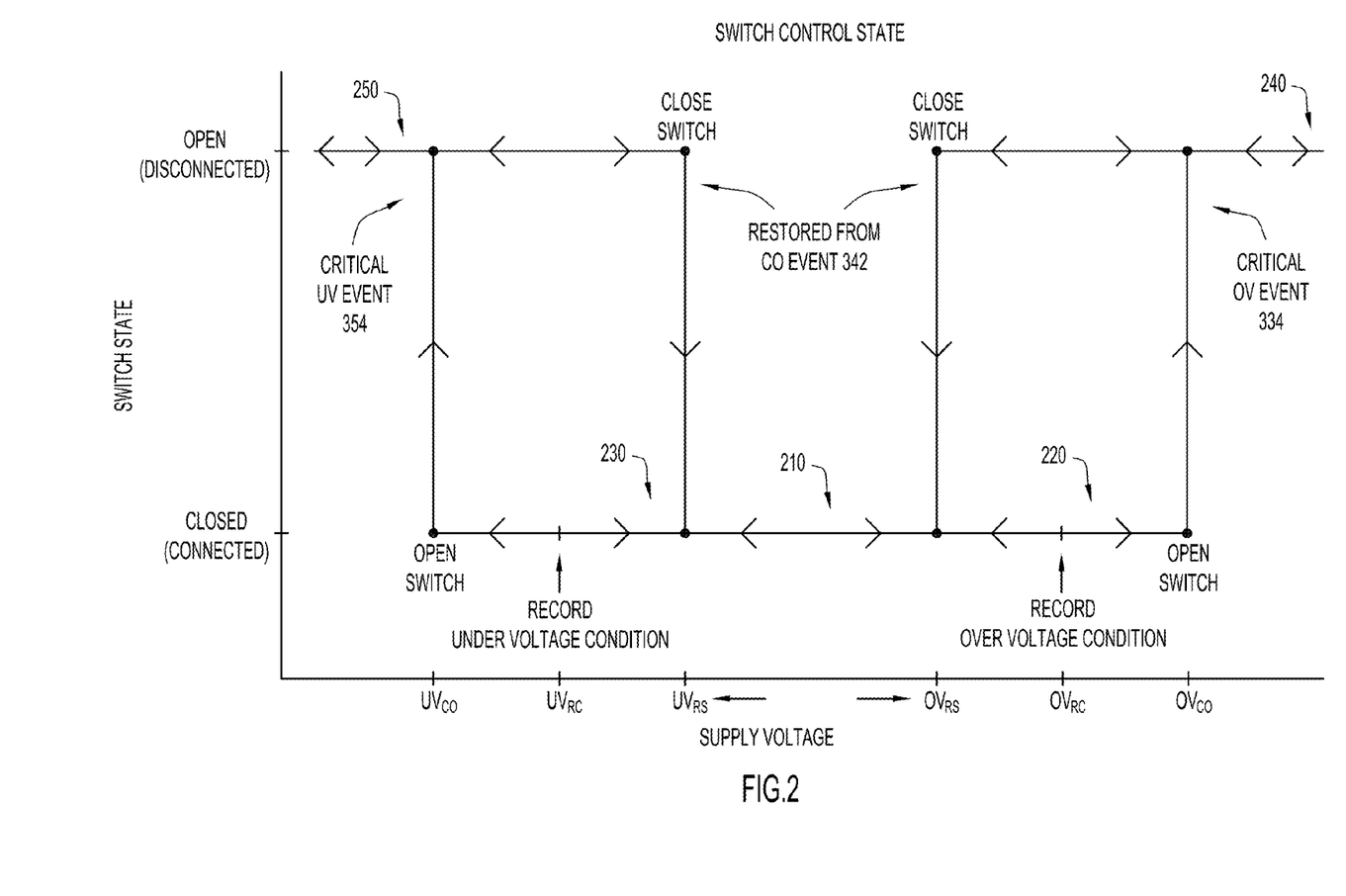
FIG. 2 is a graph illustrating monitored AC supply voltages of the PCDMS of FIG. 1 relative to various AC input voltage thresholds.
Figure 3:
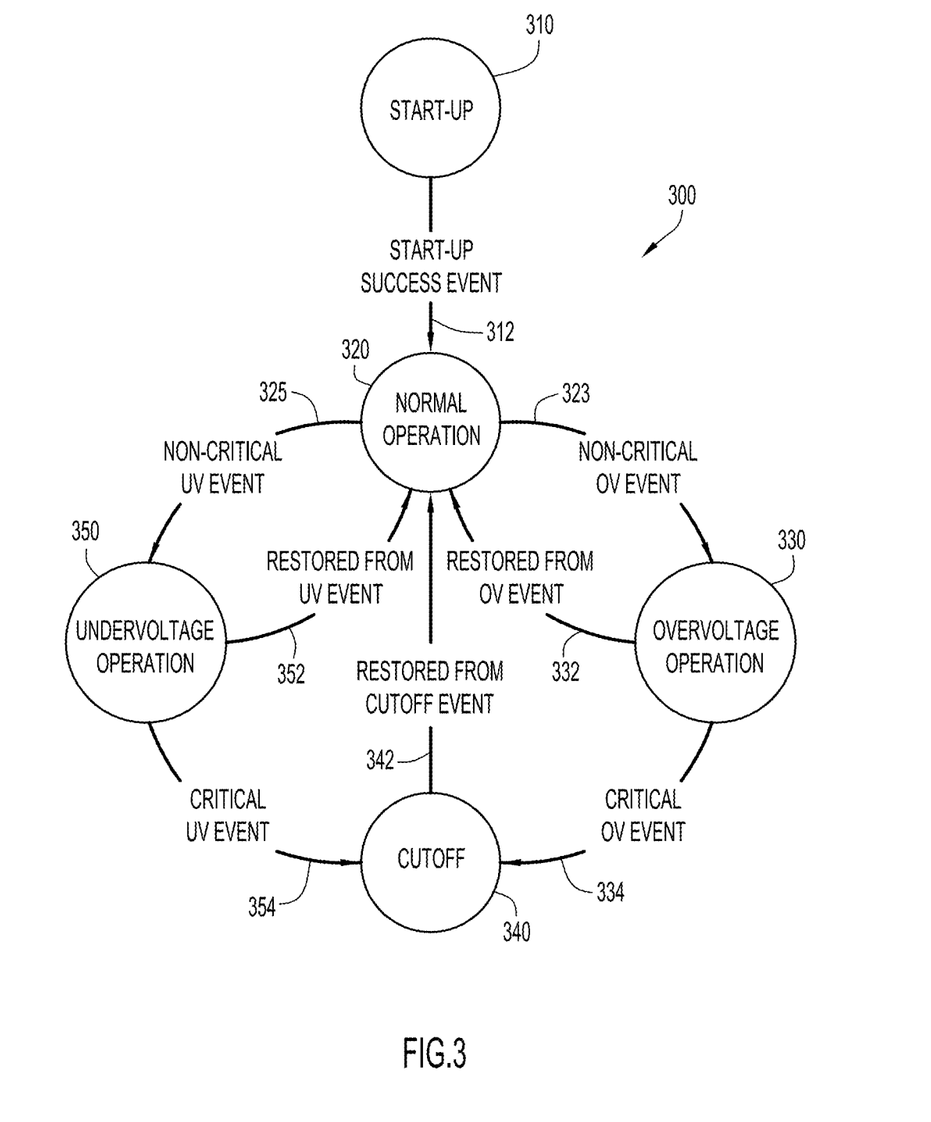
FIG. 3 is a state diagram illustrating operational states of a power controller in the PCDMS of FIG. 1.

For purposes of description, the overvoltage and undervoltage restore threshold levels ($OV_{RS}$ and $UV_{RS}$) respectively represent the upper and lower bounds of acceptable voltage levels, or what is considered the "normal" range of operating voltages, illustrated as region 210 in FIG. 2. For example, a single phase AC voltage supplied by the U.S. power grid that is in the range of 105 Vrms to 130 Vrms might be considered sufficiently close to the nominal supply voltage level of 120 Vrms for typical AC circuits to operate without adverse effects.

Power controller 142 may be placed in a Start-Up state 310 when PCDMS 100 is put into operation. While in Start-Up State 310, PCDMS 100 may initialize and begin execution of various of its processes, including an input voltage sampling process associated with supply sampling circuit 122 and an input voltage monitoring process associated with monitor 144. Power controller 142 may remain in Start-Up State 310 until a Start-Up Success Event 312, which occurs when supply voltage sample signal $V_{IN}$ is in the Normal range, i.e., between the overvoltage and undervoltage restore thresholds, $OV_{RS}$ and $UV_{RS}$. On this event, power controller 142 transitions to a Normal Operation State 320, in which power controller 142 generates switch control signal 135 in an "on" state that compels switch circuit 130 into a conductive state (closed), to connect input circuitry 112 with output circuitry 114. Thus, while power controller 142 is in Normal Operation State 320, power from AC power source 10 is delivered to loads 17 as long as overcurrent protection devices 162 are in conductive states. Power controller 142 may remain in Normal Operation State 320 as long as monitor 144 resolves that $V_{IN}$ is in the Normal range 210.

While power controller 142 is in Normal Operation State 320, monitor 144 periodically evaluates supply voltage sample signal $V_{IN}$ to determine whether the supply voltage is acceptable or whether some degree of overvoltage or undervoltage has developed. Referring to FIG. 2, if the supply voltage sample signal $V_{IN}$ rises to the point where it exceeds the overvoltage restore threshold $OV_{RS}$, i.e., region 220 in FIG. 2, then a Non-Critical Overvoltage event 323 is said to occur and, in response, power controller 142 transitions to Overvoltage Operation State 330. While in this state, power controller compels switch circuit 130 to remain in a conducting state and input circuitry 112 and output circuitry 114 remain connected. However, some other activity may be compelled as well. For example, if the supply voltage sample signal $V_{IN}$ continues to rise to the point where it exceeds the overvoltage record threshold ($OV_{RC}$), an "overvoltage record routine" may be executed that generates data indicative of the parameters surrounding the event. In one embodiment, a count of overvoltage events is stored in storage 180, such as at logs storage location 186. The overvoltage record routine may include incrementing the overvoltage count and storing the incremented count value in logs storage location 186. The overvoltage record routine may retrieve the time of the event from timers 147 and utilize this value as a time of the occurrence of the overvoltage event. The occurrence time can be an elapsed time since the last event, an elapsed time since the beginning of a timing period or interval, or a time of day. Optionally, control circuit 140 can send a display control signal to local UI 174 to display the incremented overvoltage count value. Further, control circuit 140 can send a message to an external device, such as terminal 14, containing the overvoltage event information, such as the event count value and occurrence time information.

It is possible that the supply voltage may fluctuate above and below the overvoltage record threshold ($OV_{RC}$) over a short period of time. To prevent this condition from generating a rapid series of overvoltage reports, certain embodiments require the supply voltage sample signal to drop back below the overvoltage restore threshold ($V_{IN} < OV_{RS}$), placing power controller 142 in the Normal Operation State 320 before another overvoltage record operation can be executed. In other words, once PCDMS 100 has recorded an occurrence of overvoltage event while power controller is in the Overvoltage Operation State 330, no further overvoltage events will be recorded until power controller 142 either first returns to the Normal Operation State 320 and subsequently transitions back into the Overvoltage Operation State 330 or power controller 142 transitions from the Overvoltage Operation State 330 to the Cutoff State 340, as described below. According to another possible implementation, once in the Overvoltage Operation State 330, the supply voltage sample signal $V_{IN}$ can be periodically evaluated and, if the supply voltage sample signal remains above the overvoltage record threshold ($OV_{RC}$) for a predetermined amount of time, another overvoltage record routine can be executed.

If the supply voltage sample signal rises above the overvoltage cutoff threshold, ($OV_{CO}$), i.e., region 240 in FIG. 2 where $V_{IN} > OV_{CO}$, while power controller 142 is in the Overvoltage Operation State 330, then a critical overvoltage event 334 is said to occur and, in response, power controller 142 transitions to the Cutoff State 340. In this state, in addition to again executing the overvoltage record routine, power controller 142 generates switch control signal 135 in an off state that compels switch circuit 130 into a non-conductive or "off" state (open), thereby disconnecting input circuitry 112 from output circuitry 114 or "cutting off" power to output terminals 166 and to protected equipment. For example, where switch 130 is an electromagnetic relay switch, power controller 142 may remove relay coil voltage, causing the contacts of the relay to open and thereby disconnecting AC power to downstream components and connected equipment. This operation is reflected in FIG. 2 where the supply voltage sample signal crosses $OV_{CO}$.

According to one option, events in which the supply voltage signal exceeds the overvoltage cutoff threshold ($V_{IN} > OV_{CO}$) can be recorded separately from events in which the supply voltage signal merely exceeds the overvoltage record threshold, but not the overvoltage cutoff threshold ($OV_{RC} < V_{IN} \leq OV_{CO}$), e.g., two different overvoltage counts can be maintained, one for exceeding only the lower overvoltage record threshold and one for exceeding the higher overvoltage cutoff threshold.

As shown in FIG. 2, once power controller 142 is in the Cutoff State 340, switch circuit 130 remains non-conductive/open even if the supply voltage sample signal $V_{IN}$ falls below the overvoltage cutoff threshold level $OV_{CO}$ or even if the supply voltage sample signal $V_{IN}$ falls below the overvoltage record threshold level $OV_{RC}$. In certain embodiments, switch circuit 130 will only return to a conducting state upon a restored from cutoff event 342 to transition back to the Normal Operation State 320, which only occurs when the supply voltage sample signal $V_{IN}$ drops to the Normal range, i.e., between the overvoltage and undervoltage restore thresholds ($UV_{RS} < V_{IN} < OV_{RS}$). When this occurs, power controller 142 will generate switch control signal 135 in an on state that compels switch circuit 130 into a conductive state, e.g. energizing a relay coil to cause the relay contacts to close, thereby passing AC power to downstream device components and connected equipment. Such hysteresis may be built into the switch control mechanism, thereby preventing rapid on-and-off cycles in response to a fluctuating supply voltage.

Summarizing operation of control circuit 140 in relation to the overvoltage thresholds, in response to the supply voltage sample signal $V_{IN}$ being below a first (restore) overvoltage threshold and above undervoltage restore voltage and switch circuit 130 being in the non-conductive state, control circuit 140 controls switch circuit 130 to switch to the conductive state. In response to the supply voltage sample signal $V_{IN}$ exceeding a second (record) overvoltage threshold that is higher than the first (restore) overvoltage threshold while switch circuit 130 is in the conductive state, control circuit 140 records an overvoltage event and controls switch circuit 130 to remain in the conductive state. In response to the supply voltage sample signal $V_{IN}$ exceeding a third (cutoff) overvoltage threshold that is higher than the second (record) overvoltage threshold while switch circuit 130 is in the conductive state, control circuit 140 controls switch circuit 130 to switch to the non-conductive state and, optionally, records this as another overvoltage event.

Similarly, if from the Normal Operation State 320, the periodically monitored supply voltage signal $V_{IN}$ falls to the point where it is lower than the undervoltage restore threshold $UV_{RS}$, i.e., region 230 in FIG. 2 where $V_{IN} < UV_{RS}$, then a non-critical undervoltage event 325 is said to occur and, in response, power controller 142 transitions into the Undervoltage Operation State 350. While in this state, power controller compels switch circuit 130 to remain in a conducting state and input circuitry 112 and output circuitry 114 remain connected. However, some other activity may be compelled as well. For example, if the supply voltage sample signal $V_{IN}$ continues to fall to the point where it is below the undervoltage record threshold ($UV_{RC}$), an "undervoltage record routine" may be executed that generates data indicative of the parameters surrounding the event. In one embodiment, a count of undervoltage events is stored in the non-volatile memory of storage 180, such as at logs storage location 186. The undervoltage record routine may include incrementing the undervoltage count and storing the incremented count value in logs storage location 186. Further, the undervoltage record routine may obtain the time of the event from timers 147 and record this time value as the time at which the undervoltage event occurred. As with the overvoltage events, the recorded undervoltage event time can be an elapsed time since the last event, an elapsed time since the beginning of a timing period or interval, or a time of day. Optionally, control circuit 140 can send a display control signal to local UI 174 to display the incremented undervoltage count value. Further, control circuit 140 can send a message to an external device, such as terminal 14, through access interface 170 containing the undervoltage event information (e.g., event count value and event occurrence time information).

It is possible that the supply voltage signal may fluctuate above and below the undervoltage record threshold ($UV_{RC}$) over a short period of time. To prevent this condition from generating a rapid series of undervoltage reports, certain embodiments require the supply voltage sample signal to exceed the undervoltage restore threshold ($V_{IN} > UV_{RS}$), at which point a restored from UV event 352 is said to occur, whereby power controller 142 transitions back into the Normal Operation State 320, before another undervoltage record operation can be executed. In other words, once power controller 142 is in the Undervoltage Operation State 350, no further undervoltage conditions will be recorded unless either power controller 142 first returns to the Normal Operation State 320 in response to a restore from UV event 352 and then again transitions to the Undervoltage Operation State 350 or power controller 142 transitions to the Cutoff State 340. According to another possible implementation, once in the Undervoltage Operation State 350, the supply voltage sample signal $V_{IN}$ can be periodically evaluated and, if the supply voltage signal remains below the undervoltage record threshold ($UV_{RC}$) for a predetermined amount of time, another undervoltage record routine can be executed.

If the supply voltage sample signal falls below the undervoltage cutoff threshold, i.e., region 250 in FIG. 2 where $V_{IN}<UV_{CO}$, while power controller 142 is in the Undervoltage Operation State 350, then a critical undervoltage event 354 is said to occur and, in response, power controller 142 transitions to the Cutoff State 340. As in the critical overvoltage case, in this state, in addition to again executing the undervoltage record routine, power controller 142 generates switch control signal 135 in an off state that compels switch circuit 130 into a non-conductive or "off" state (open), thereby disconnecting input circuitry 112 from output circuitry 114 or "cutting off" power to output terminals 166 and to protected equipment. This operation is reflected in FIG. 2 where the supply voltage sample signal falls below $UV_{CO}$.

According to one option, events in which the supply voltage signal falls below the undervoltage cutoff threshold ($V_{IN}<UV_{CO}$) can be recorded separately from events in which the supply voltage signal merely falls below the undervoltage record threshold, but not the undervoltage cutoff threshold ($UV_{CO}<V_{IN}\leq UV_{RC}$), e.g., two different undervoltage counts can be maintained, one for falling below only the higher undervoltage record threshold and one for falling below the lower undervoltage cutoff threshold.

As shown in FIG. 2, once power controller 142 is in the Cutoff State 340, switch circuit 130 remains non-conductive/open even if the supply voltage sample signal $V_{IN}$ rises above the undervoltage cutoff threshold level $UV_{CO}$ or even if the supply voltage sample signal $V_{IN}$ rises above the undervoltage record threshold level $UV_{RC}$. As in the overvoltage case, in certain embodiments, switch circuit 130 will only return to a conducting state upon a restored from cutoff event 342 to transition back to the Normal Operation State 320, which only occurs when the supply voltage sample signal $V_{IN}$ rises to the Normal range, i.e., between the overvoltage and undervoltage restore thresholds ($UV_{RS}\leq V_{IN}\leq OV_{RS}$). When this occurs, power controller 142 will generate switch control signal 135 in an on state that compels switch circuit 130 into a conductive state, e.g. energizing a relay coil to cause the relay contacts to close, thereby passing AC power to downstream device components and connected equipment. Such hysteresis may be built into the switch control mechanism, thereby preventing rapid on-and-off cycles in response to a fluctuating supply voltage.

Summarizing operation of control circuit 140 in relation to the undervoltage thresholds, in response to the supply voltage sample signal $V_{IN}$ being above a first (restore) undervoltage threshold and below overvoltage restore and switch circuit 130 being in the non-conductive state, control circuit 140 controls switch circuit 130 to switch to the conductive state. In response to the supply voltage sample signal $V_{IN}$ falling below a second (record) undervoltage threshold that is lower than the first (restore) undervoltage threshold while switch circuit 130 is in the conductive state, control circuit 140 records an undervoltage event and controls switch circuit 130 to remain in the conductive state. In response to the supply voltage sample signal $V_{IN}$ falling below a third (cutoff) undervoltage threshold that is lower than the second (record) undervoltage threshold while switch circuit 130 is in the conductive state, control circuit 140 controls switch circuit 130 to switch to the non-conductive state and, optionally, records this as another undervoltage event.

Figure 4:
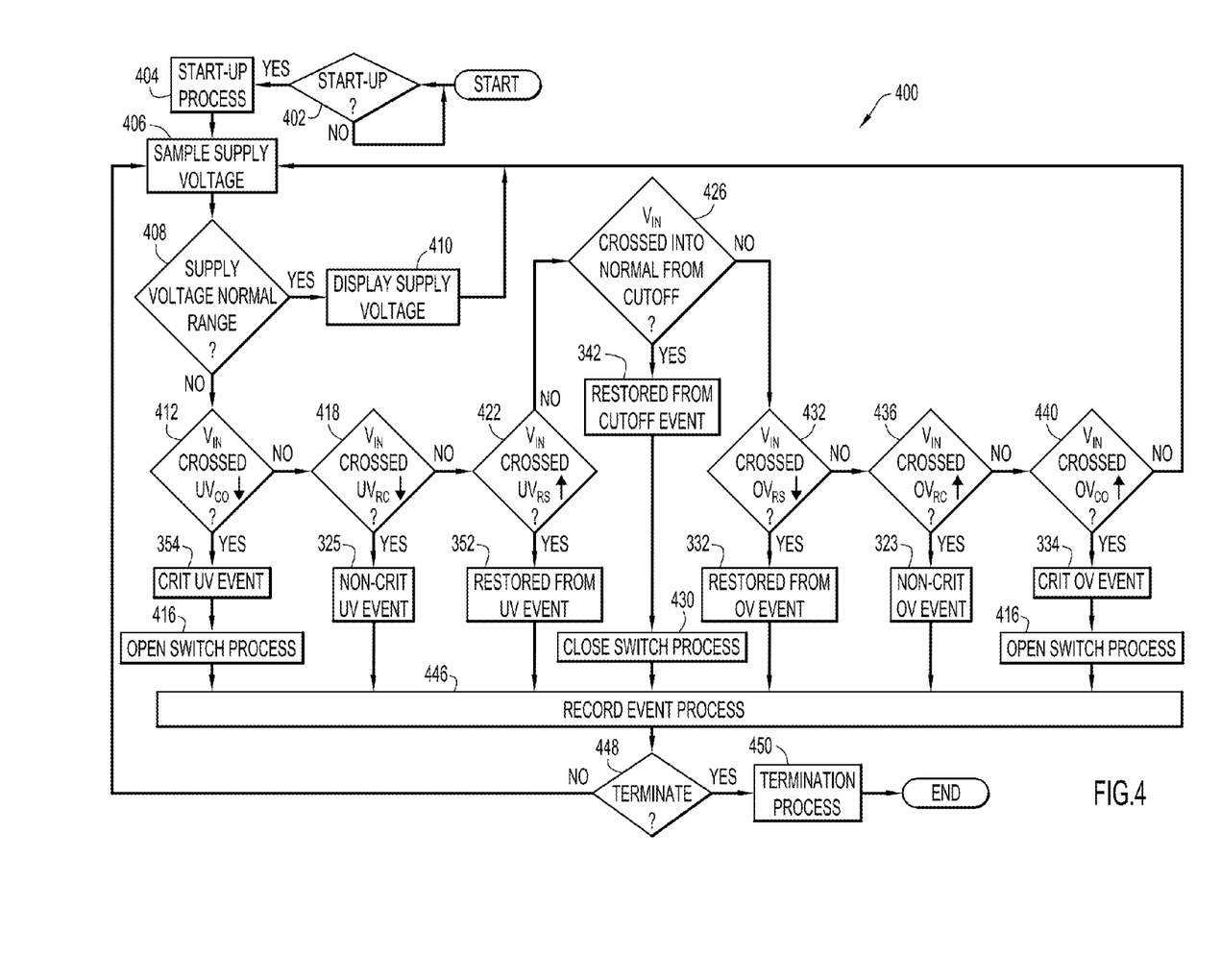
FIG. 4 is a functional flow diagram of an example control process of the PCDMS of FIG. 1 in response to supply voltage conditions.

FIG. 4 is a flow diagram of example PCDMS control process 400 by which the present invention might be embodied. It is to be understood that the flow diagrams illustrated and described herein represent generalized logic through which various processes for embodiments of the present invention may be implemented. The linear and sequential flow of operations depicted in the flow diagrams are solely for explanation purposes and such linear and sequential flow may not be realized in physical embodiments of the invention. The skilled artisan will recognize and appreciate that numerous variations, alternatives, modifications, etc., to the processes described herein by way of the flow diagrams can be practiced without departing from the spirit and intended scope of the present invention.

In operation 402, control circuit 140 may determine whether system start-up has been initiated, such as by determining that a supply voltage has been provided at input terminals 105, and may wait until such determination is affirmed. Upon a determination that start-up has been initiated, control process 400 may transition to operation 404 in which a start-up process is performed. Such start-up process may initialize circuitry and initiate various processes on control circuit 140, such as power controller 142, monitor 144, logger 146, timers 147 and configurator 148. Control circuit 140 may retrieve stored operating parameters from parameter storage location 184, such as values for the various voltage thresholds $UV_{CO}$, $UV_{RC}$, $UV_{RS}$, $OV_{RS}$, $OV_{RC}$ and $OV_{CO}$, and initialize monitor 144 with these thresholds. Timers 147 may be initialized with timing values, such as a sampling interval at which $V_{IN}$ is generated from the supply voltage. In operation 406, the supply voltage is sampled and supply voltage sample signal $V_{IN}$ is provided to monitor 144. If, in operation 408, it is determined that the supply voltage is within the normal operating range, e.g., region 210 in FIG. 2, corresponding to Start-Up Success Event 312 in FIG. 3, control circuit 140 may generate switch control signal 135 to compel switch circuit 130 into a conductive state and may display the measured supply voltage on local UI 174 in operation 410. Control process 400 may then return to operation 406 where a new sample of the supply voltage is taken. If, in operation 408 it is determined that the supply voltage is not in the normal range, then control process 400 determines which of a plurality of power quality events has occurred.

If it is determined in operation 412 that the supply voltage sample signal $V_{IN}$ has crossed the undervoltage cutoff threshold $UV_{CO}$ by falling below that threshold from a higher voltage (indicated by the arrow in block 412), then a critical undervoltage event 354 has occurred and, in operation 416, an open switch circuit process is executed. Similarly, if it is determined in operation 440 that the supply voltage sample signal $V_{IN}$ has crossed the overvoltage cutoff threshold $OV_{CO}$ by rising above that threshold from a lower voltage, then a critical overvoltage event 334 has occurred and, in operation 416, the open switch circuit process is executed. The open switch circuit process (and the corresponding close switch circuit process) is dependent upon the construction of the switch circuit and will be described for a specific switch circuit implementation below. In addition to the open switch process, control circuit 140 may execute a record event process in operation 446.

Figure 5:
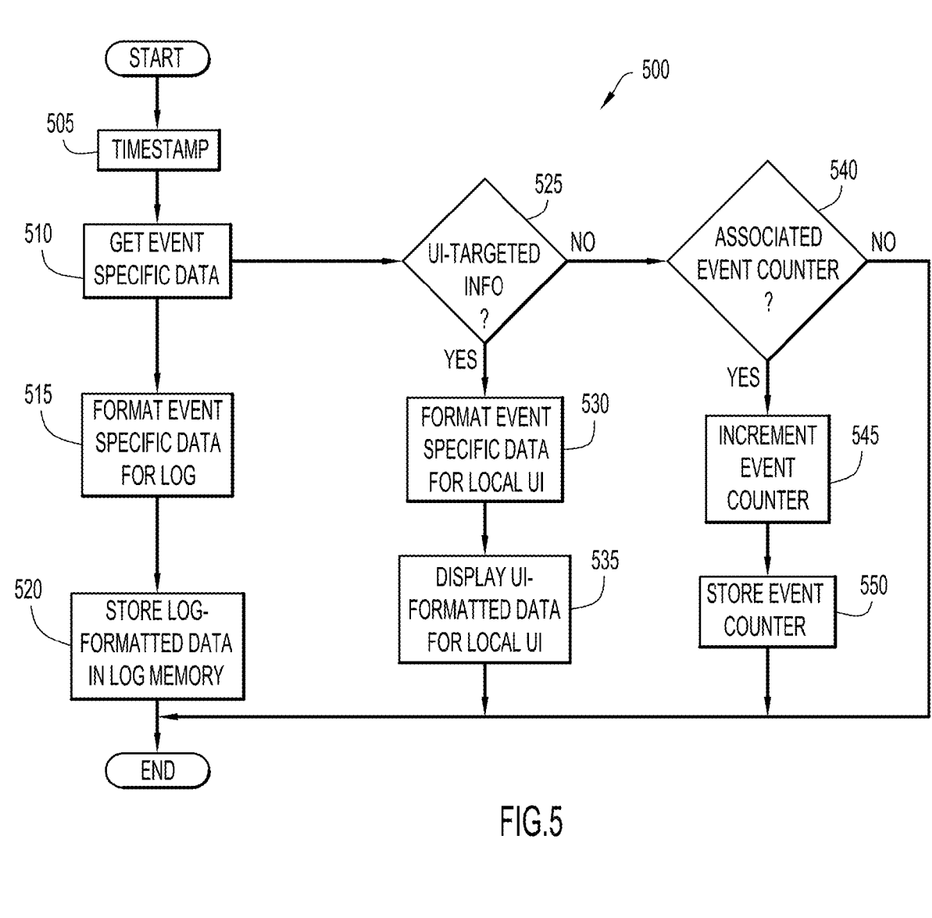
FIG. 5 is a functional flow diagram of an event recording process that is executed in response to various power quality events in the PCDMS of FIG. 1.

Referring momentarily to FIG. 5, an exemplary record event process 500 is illustrated. In operation 505, a timestamp is generated, such as by a real-time clock in timers 147. As stated above, such timestamp may be an indication of the calendar date and time of day, an indication of the time that has lapsed since the most recent event, and so on. In operation 510, event specific data are obtained, such as, for example, what event occurred, (e.g., critical undervoltage event, non-critical overvoltage event, etc.), what criteria was met to cause the event (e.g., undervoltage cutoff threshold crossed, supply voltage above normal range, etc.), what were the system parameters and measured quantities at the time of the event (e.g., undervoltage cutoff threshold=80 Vrms; supply voltage=78 Vrms, etc.), and so on. The present invention is not limited to the data that are tracked and that can be recorded at various times in PCDMS 100; such data may include, without being limited to, instantaneous line-to-line (LL) voltage measurement, line-to-neutral (LN) voltage measurement, instantaneous neutral-to-ground (NG) voltage measurement, instantaneous current measurement, root-mean-squared (RMS) LL voltage measurement, RMS LN voltage measurement, RMS NG voltage measurement, RMS current measurement, peak LL voltage, peak LN voltage, average power measurement, energy usage, power factor, line frequency, crest factor, temperature measurement, power outage count, undervoltage event count (no cutoff), undervoltage event count (cutoff), overvoltage event count (no cutoff), overvoltage event count (cutoff), surge count, undervoltage cutoff threshold, undervoltage record threshold, undervoltage restore point, overvoltage cutoff threshold, overvoltage record threshold and overvoltage restore point. In operation 515, the event data are formatted into a suitable data log format, such as a comma-separated variable format, tabular data format, or any other data file format, essentially without limitation. In operation 520, the formatted event data are stored in memory, such as in logs storage location 186 of storage 180 in FIG. 1.

In operation 525, it is determined whether the event data are among those that are to be displayed on local UI 174. Certain embodiments may display event specific data for only select events (e.g., critical events) and not display any special data for other events (e.g., non-critical events). If the event data are targeted for display, as determined in operation 525, the event specific data are formatted for display on local UI 174 in operation 530 and the formatted data are displayed in operation 535.

In operation 540, it is determined whether there is an event counter associated with the event. If so, the event counter is incremented in operation 545 and the new event counter value may be stored in operation 550.

Returning once again to FIG. 4, if it is determined in operation 418 that the supply voltage sample signal $V_{IN}$ has crossed the undervoltage record threshold $UV_{RC}$ by falling below that threshold from a higher voltage, then a non-critical undervoltage event 325 has occurred and control process 400 transitions to operation 446, in which the event is recorded by record event process 500. Similarly, if it is determined in operation 436 that the supply voltage sample signal $V_{IN}$ has crossed the overvoltage record threshold $OV_{RC}$ by rising above that threshold from a lower voltage, then a non-critical overvoltage event 323 has occurred and control process 400 transitions to operation 446, in which the event is recorded by record event process 500.

In operation 422, it is determined whether the supply voltage sample signal $V_{IN}$ has crossed the undervoltage restore threshold $UV_{RS}$ by rising above that threshold from a lower voltage. If such is the case, then a restored from UV event 352 has occurred and, in certain embodiments, control circuit 140 may execute a record event process in operation 446, although in certain embodiments, restore events, with the possible exception of restored from cutoff events, are not recorded. Similarly, in operation 432, it is determined whether the supply voltage sample signal $V_{IN}$ has crossed the overvoltage restore threshold $OV_{RS}$ by falling below that threshold from a higher voltage. If such is the case, then a restored from OV event 332 has occurred and, in certain embodiments, control circuit 140 may execute a record event process in operation 446.

In operation 426, it is determined whether the supply voltage sample signal $V_{IN}$ has been restored to the normal operating range from a critical overvoltage or undervoltage condition that resulted in power controller 142 transitioning into the Cutoff State 340. If so, a restored from cutoff event 342 has occurred and control process 400 may transition into the close switch process in operation 430, a specific implementation of which is described in detail below. In certain embodiments, control circuit 140 may execute a record event process in operation 446.

In operation 448, it is determined whether control process is to be terminated and, if so, a termination process may be executed in operation 450. Such a termination process may open switch circuit 130, ensure that all data logging activities are complete, including, in certain embodiments, logging the time at which the termination process was initiated, and other operations by which PCDMS 100 is gracefully shut down.

It will be appreciated that having separate record and cutoff threshold levels allows for the recording of overvoltage and undervoltage conditions (i.e., creating a history of overvoltage and undervoltage events) that may be disruptive to connected equipment without actually disconnecting power to connected equipment. Supply voltage levels that may be damaging to connected equipment (i.e., outside the cutoff thresholds) can be addressed by recording the event and disconnecting power from the connected equipment.

Returning to FIG. 1, access interface 170 may be configured with appropriate signaling circuitry to allow control circuit 140 to transmit information, such as the status of PCDMS 100 and event history (e.g., event logs, overvoltage and undervoltage counts) to an external device, such as terminal 14, which may be a computer, a microcontroller, a memory device, etc., for storage and analysis. In addition to transmitting data from PCMDS 100 to an external device, access interface 170 allows for transmission of data, such as device control parameters, from an external device to PCMDS 100. For example, according to one option, an external device can supply overvoltage and undervoltage threshold values to configurator 148 in control circuit 140, which can then be stored in parameter storage location 184 to override or replace previously stored or default values.

In one embodiment, for instance, PCDMS 100 can be interfaced to a computer running a program that, among other things, allows the end user to select from a list of overvoltage and undervoltage threshold levels. These user-selected thresholds are then transmitted to control circuit 140, which, by way of configurator 148, replaces or overwrites previous used or default thresholds in parameter storage location 184 with the end user selected thresholds. Because PCDMS 100 is designed to protect a variety of sensitive equipment, this feature allows the end-user to customize the record and shutdown thresholds to be compatible with connected equipment.

According to another feature, control circuit 140 can also be programmed to perform routines in response to interrupts. In one implementation, control circuit 140 is configured, using timers 147, to trigger a timer interrupt that increments an elapsed time timer (seconds, minutes, hours, and days) since the most recent recorded event (overvoltage, undervoltage, power outage or surge event). Thus, in response to one of the above power quality events, in addition to incrementing and storing the applicable event count, control circuit 140 may also store the elapsed time since the previous event.

Access interface 170 may be configured to connect control circuit 140 to a computer running software by which the event data can be analyzed, displayed, and stored. Such software may be configured to retrieve data from logs 186, including, but not limited to recorded measurement data, time-stamped power quality events, etc., display the log data, analyze the log data and generate reports based on the analysis.

Figure 6:
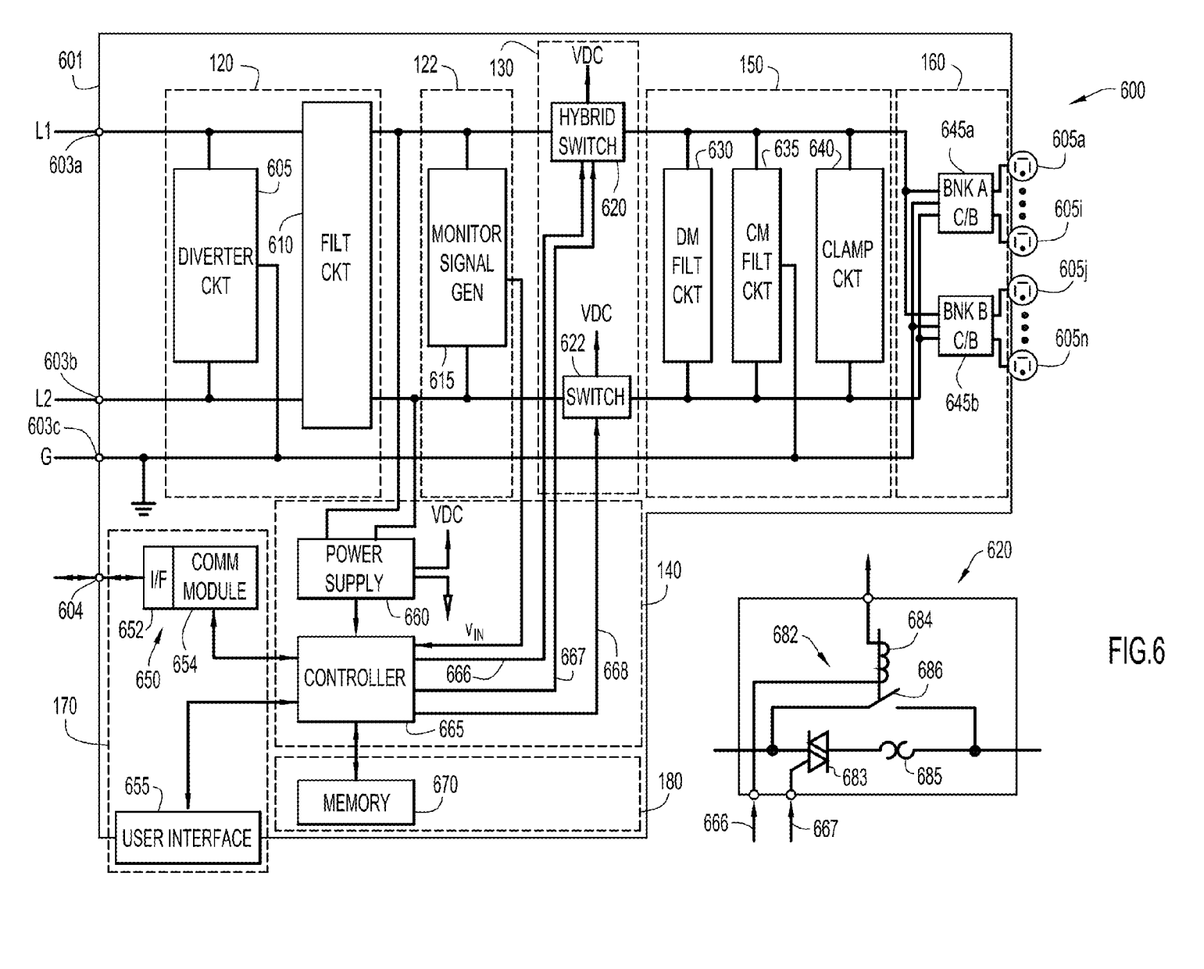
FIG. 6 is a diagrammatic illustration of another PCDMS by which the present general inventive concept can be embodied.

FIG. 6 is a schematic block diagram of PCDMS 600 revealing additional details for purpose of describing possible features in certain embodiments of the present invention. PCDMS 600 may be substantially equivalent in basic functionality to PCDMS 100 and the circuits in PCDMS 600 are identified by like reference numerals as those used in FIG. 1 for describing PCDMS 100. That is, PCMDS 600 may include a primary conditioning circuit 120, a supply sampling circuit 122, a switch circuit 130, a control circuit 140, a supplemental conditioning circuit 150, an output distribution circuit 160, an access interface circuit 170 and storage 180. Exemplary implementations of each of these subsystems are described in the paragraphs that follow and the skilled artisan will recognize numerous other implementations by which the present invention may be embodied.

Exemplary PCDMS 600 is a three-wire, split-phase AC power conditioning, distribution and management system, which is similar in configuration to a single-phase implementation, in which case line conductor L2 would be replaced by a neutral N conductor. However, it is to be understood the present invention is not limited to a particular supply voltage delivery architecture.

The circuitry of PCDMS 600 may be contained on a common platform or in a common housing, representatively illustrated by housing 601. A plurality of input terminals, representatively referred to herein as input terminal(s) 603, may be disposed on the exterior of housing 601 to include line voltage input terminals 603a-603b and ground terminal 603c. In certain embodiments, input terminals 603 are part of a connector at the end of a power cable. A plurality of output terminals, representatively referred to herein as power receptacle(s) 605, may also be disposed on the exterior of housing 601 from which load devices can derive electrical power to include a bank of power receptacles 605a-605i and another bank of power receptacles 605j-605n. A communication port 604 may be provided on the housing 601 as well as a user interface panel 655. Other components may be accessible from outside housing 601. It is to be understood that while housing 601 is illustrated as a single container, PCDMS 600 may be realized in multiple, separate housings interconnected by suitable power, data and control signal links.

Supply voltage is provided from terminals 603 to primary conditioning circuit 120, which may include a diverter circuit 605 and a filter circuit 610. Diverter circuit 605 may implement shunt energy suppression by way of suppressor components including gas discharge tubes, varistors, silicon avalanche diodes, etc., whereby the energy of normal and common mode transients is diverted to the ground or neutral conductor. In certain embodiments, diverter circuit 605 may implement series energy suppression by way of suppressor components including inductors, capacitors, silicon controlled rectifiers (SCRs), triacs, metal-oxide-semiconductor field effect transistors (MOSFETs), etc., whereby which the transient energy is dissipated as opposed to being shunted to the ground or neutral conductor. Circuitry suitable for this purpose is disclosed in U.S. Pat. Nos. 4,870,528 and 4,870,534, which are incorporated by reference as if fully set forth herein. Filter circuit 610 may include filter components (inductors and capacitors) to provide primary filtering of normal and common mode EMI.

As stated above, supplemental conditioning circuit 150 extends the conditioning of primary conditioning circuit 120. To that end, supplemental conditioning circuit 150 may include filter circuits 630 and 635 and clamp circuit 640. Filter circuits 630 and 635 may include filter components (inductors and capacitors) to provide supplemental filtering of normal and common mode EMI. Clamp circuit 640 may include suppressor components (varistors, silicon avalanche diodes, semiconductor switching components (SCRs, triacs, MOSFETs, etc.), and capacitors) to provide supplemental suppression of normal and common mode transients. Diverter circuit 605 and filter circuit 610 of primary conditioning circuit 120 and filter circuits 630 and 635 and clamp circuit 640 of supplemental conditioning circuit 150 may be constructed similar to those disclosed in U.S. Pat. No. 5,136,455, for example, the disclosure of which is hereby incorporated by reference in its entirety.

Exemplary power distribution circuit 160 includes circuit breakers 645a-645b, representatively referred to herein as circuit breaker(s) 645, each protecting a corresponding bank of power receptacles 605. In the example embodiment, circuit breakers 645 are split-phase circuit breakers rated for 230V 30 A loads.

Control circuit 140 may include a power supply circuit 660 coupled to the input supply voltage to produce DC operating voltages for control circuit 140, switch circuit 130, storage 180 and access interface 170. Power supply circuit 660 may produce multiple DC voltages; for example, switch circuit 130 may require a higher voltage and current than that required for digital logic in other controller circuitry, such as controller 665. Power supply 660 may be a linear or switch mode power supply.

Controller 665 may be a microcontroller, microprocessor, digital signal processor, ASIC, field programmable array, or combinations thereof. In certain embodiments, controller 665 may be a programmable microcontroller capable of executing processing instructions stored in memory 670 and including general purpose and task-specific I/O interfaces, including analog inputs which are directed to internal A/D circuits, a real-time clock, various timers, and so on. The skilled artisan will recognize numerous commercially available microcontroller integrated circuits by which controller 665 can be implemented upon review of this disclosure.

Supply voltage sampling circuit 122 includes a monitor signal generator 615 that produces an analog DC voltage proportional to the input supply voltage. In certain embodiments, monitor signal generator 615 is a bridge rectifier that produces supply voltage sample signal $V_{IN}$, which is provided to an analog input of controller 665. In certain other embodiments, monitor signal generator 615 produces a scaled copy of the input supply voltage by, for example, a resistive voltage divider. Controller 665 may execute processing instructions that implement power controller 142, monitor 144, data logger 146 and configurator 148 and may take appropriate action based on the level of $V_{IN}$, as described above.

In the split-phase embodiment of FIG. 6, switch circuit 130 comprises two switching components: a simple switch component 622 in line conductor L2 and a hybrid switch component 620 in line conductor L1. Switch component 622 may be realized by a single electromechanical relay and hybrid switch component 620 may be constructed in accordance with the schematic diagram inset in the lower-right portion of FIG. 6. In certain embodiments, switch component 622 may also be realized as a hybrid switch component. I/O ports of controller 665 may be used to operate hybrid switch component 620 and switch 622 by switch control signals 666-668 in accordance with the state of power controller 142 as discussed above. It is to be understood that while switch control signals 666-668 are illustrated as being applied directly from controller 665 to switch components 620 and 622, certain implementations may require additional interface circuitry as drivers for the switch circuits. The open switch process and close switch process discussed with reference to FIG. 4 are described below with reference to FIG. 7.

Figure 7:
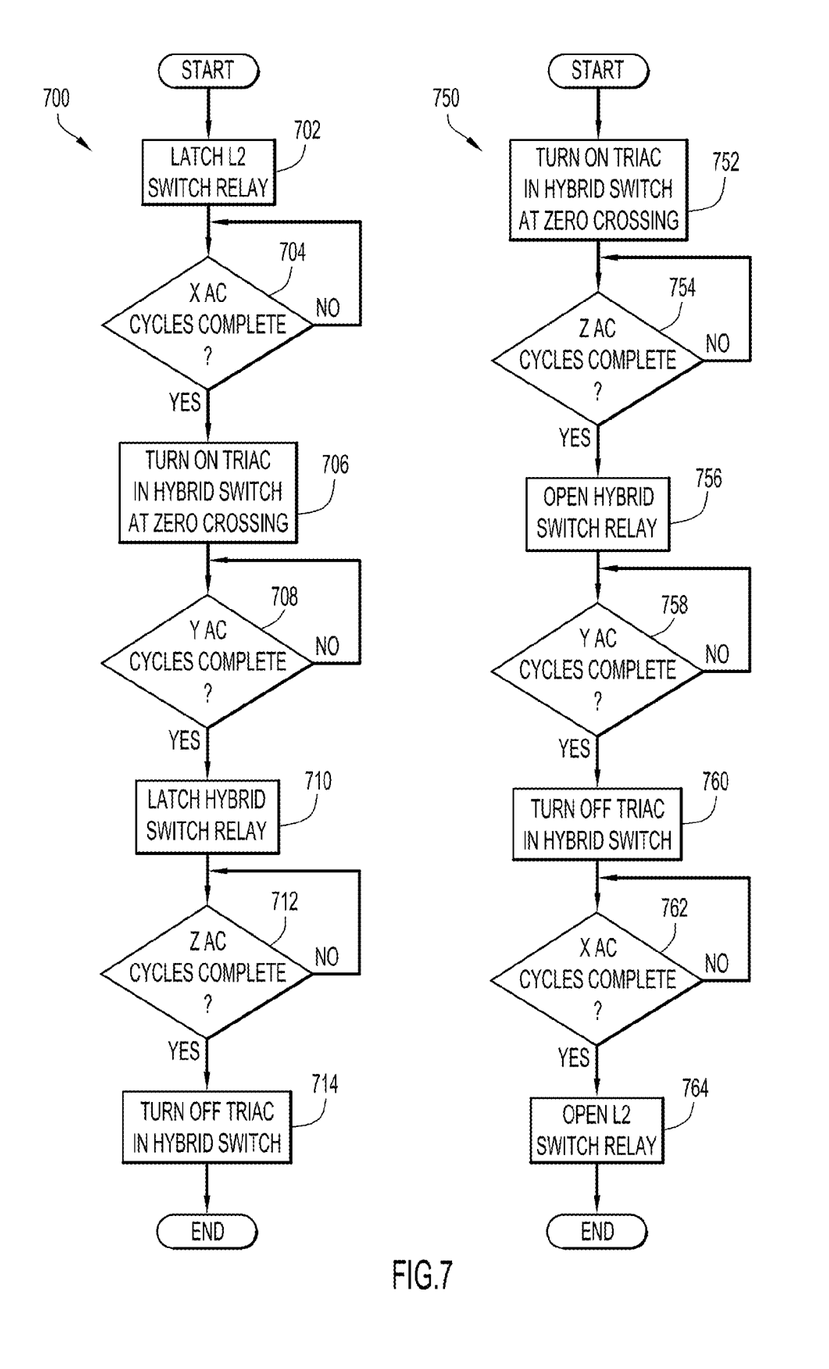
FIG. 7 is a functional flow diagram of open switch and close switch processes for selectively connecting and disconnecting connected load equipment from connected AC supply power in the embodiment illustrated in FIG. 6.

FIG. 7 depicts a set of flow diagrams representing a close switch process 700 and an open switch process 750. Beginning with close switch process 700, switch component 622 is latched (closed) by application of switch control signal 668 to the coil of the relay (not illustrated) in switch component 622. Close switch process 700 then waits for a predetermined number of cycles (typically one) of the AC input voltage to allow sufficient time for switch component 622 to latch closed. In operation 706, and referring to the inset diagram of hybrid switch 620, switch control signal 667 is applied so that triac 683 is turned on at a zero crossing of the input supply voltage. In certain embodiments, this is achieved by way of a zero crossing optical coupler interposed in the signal circuitry of switch control signal 667. When triac 683 is turned on into a conducting state, current begins to flow between input circuitry 112 and output circuitry 114 through triac 683 and a limiting element (such as negative temperature coefficient (NTC) resistors) 685. It is to be understood that while only one limiting element 685 is illustrated in FIG. 6, embodiments of the present invention may incorporate more than one such element in hybrid switch circuit 620. In operation 708, close switch process 700 waits a predetermined number of AC supply voltage cycles (for example, five) to allow inrush current to be ameliorated by limiting device(s) after the zero-crossing activation of triac 683. In operation 710, switch control signal 666 is applied to the coil 684 of relay 682 in hybrid switch component 620, in response to which, contacts 686 are latched closed to form a conductive bypass around triac 683 and limiting device 685. In operation 712, close switch process 700 waits a predetermined number of AC supply voltage cycles (for example, four) to ensure that relay 682 has had sufficient time to latch closed and, in operation 714, triac 683 is turned off by switch control signal 667, at which time input circuitry 112 and output circuitry 114 are connected solely through contacts 686 of relay 682 in line conductor L1 and similar contacts in the relay (not illustrated) in switch component 622 in line conductor L2.

Open switch process 750 is essentially the reverse of close switch process 700. In operation 752, switch control signal 667 switches triac 683 into a conducting state at a zero crossing of the AC input supply voltage. In operation 754, open switch process 750 waits a predetermined number of AC supply voltage cycles (for example, five) to allow limiting of any inrush current in the path containing triac 683 and limiting device 685. In operation 756, relay 682 is opened by command of switch control signal 666 and in operation 758, open switch process 750 waits a predetermined number of AC supply voltage cycles to ensure that relay 682 has opened. In operation 760, triac 683 is switched into a non-conductive state by command of switch control signal 667 and in operation 762, open switch process 750 waits a predetermined number of AC supply voltage cycles to ensure that current has ceased to flow in line conductor L1. In operation 764, switch component 622 is opened by command of switch control signal 668.

In embodiments of the present invention that implement close switch process 700 and open switch process 750, or variations thereof, and switch 130 is compelled to transition from a non-conducting state to a conducting state at a zero-crossing of the AC supply voltage, such as by hybrid switch 620, protection against damage from a particular power-related issue encountered in conventional PDUs is realized. A condition occasionally develops in conventional PDUs when there is a disruption in the AC supply power while attached load equipment is operating. Depending on the power control circuitry in the load, e.g., on/off switch, should such even exist, significant current may be demanded by the load equipment when the AC power is restored. While this current draw may be in excess only temporarily, it may enough to trip the corresponding circuit breaker in the PDU. In embodiments of the present invention, however, disruption in the AC voltage would result in switch 620 transitioning into a non-conductive state and would not return to a conductive state until a start-up success event 312 causes power controller 142 into Normal Operation state 320, which occurs only when the AC supply voltage has reached its nominal level. Then, switch 620 transitions to the "on" state at a zero crossing of the AC supply voltage, and connecting load equipment through limiting elements 685, thus limiting the amount of current that can be drawn by attached load equipment.

Access interface circuit 170 may include an I/O circuit 650 for carrying out communications in a variety of protocols, such as serial communications, including that compliant with Universal Serial Bus standards and IEEE 1394, among others, parallel bus communications, wireless and wired networking standards, such as IEEE 802.X compliant communications, and so on. Accordingly I/O circuit 650 may include a communication module that implements the signaling interfaces, encoders, decoders, and so on, and an interface circuit 652 that implements the physical interface with the transmission media, including connectors, antennas, transmitters, receivers, etc. The present invention is not limited to a particular communication technique by which a user can interact with PCDMS 600.

Access interface circuit 170 may include a user interface panel 655 that implements a local UI. User interface panel 655 may include a display device, such as an LCD or LED graphical display, and one or more controls through which a user can enter data, switch between different data views or feature control menus, control PCDMS functions, and so on. The present invention is not limited to a particular interface or features of such interface for user interface panel 655.

In certain embodiments, in addition to monitoring overvoltage and undervoltage conditions, control circuit 140 can monitor other types of supply voltage disturbances or irregularities. For example, control circuit 140 can evaluate whether a wiring fault exists, such as an open ground or a reverse polarity condition (i.e., line and neutral reversed). Further, over temperature conditions and overcurrent conditions can be monitored by control circuit 140. If one of these other disturbances occurs, control circuit can create appropriate timestamped log entries and, in certain embodiments, generate a timestamp, increment an associated disturbance count and store the count with the timestamp in memory.

Optionally, control circuit 140 can display information about disturbances on local UI 174 (e.g., the type of wiring fault, temperature measurement, etc.). When appropriate, control circuit 140 can also signal switch circuit 130 to disconnect power from the device output receptacles and protected equipment. In response, switch circuit 130 makes or breaks continuity of the line conductor with the connected equipment on the load side depending on whether one of the undesirable operating conditions has been detected (e.g., an overvoltage condition, an under-voltage, a wiring fault, an over-temperature condition, an over-current condition, etc.).

Having described preferred embodiments of new and improved supply voltage monitor, it is believed that other modifications, variations and changes will be suggested to those skilled in the art in view of the teachings set forth herein. It is therefore to be understood that all such variations, modifications and changes are believed to fall within the scope of the present invention as defined by the appended claims.

Although specific terms are employed herein, they are used in a generic and descriptive sense only and not for purposes of limitation.

What is claimed is:

1. A power distribution apparatus comprising:
a switch circuit to selectively couple input circuitry connectable to an AC power supply to output circuitry connectable to a load through an overcurrent protection device, the switch circuit being controllable into a conductive state, where an input conductor coupling the input circuitry to the switch circuit is electrically connected through the switch circuit to an output conductor coupling the output circuitry to the switch circuit, and controllable into a non-conductive state, where the input conductor is electrically disconnected from the output conductor by the switch circuit;
a supply signal sampling circuit configured to generate a supply voltage sample signal representative of a voltage of the AC power supply; and
a control circuit configured to monitor the supply voltage sample signal and to:
compel the switch circuit into the conductive state in response to the supply voltage signal being below a first overvoltage threshold while the switch circuit is in the non-conductive state;
record an indication of an occurrence of an overvoltage event and compel the switch circuit to remain in the conductive state in response to the supply voltage sample signal exceeding a second overvoltage threshold that is higher than the first overvoltage threshold while the switch circuit is in the conductive state; and
compel the switch circuit into the non-conductive state in response to the supply voltage signal exceeding a third overvoltage threshold that is higher than the second overvoltage threshold while the switch circuit is in the conductive state.

2. The apparatus of claim 1, wherein the control circuit is further configured to record an indication of the occurrence of another overvoltage event in response to the supply voltage sample signal exceeding the third overvoltage threshold while the switch circuit is in the conductive state.

3. The apparatus of claim 2, wherein the control circuit records the indication of the occurrence of the overvoltage event or the other overvoltage event by incrementing an overvoltage event counter.

4. The apparatus of claim 3, wherein the control circuit is further configured to record an indication of a time at which the overvoltage event or the other overvoltage event occurred.

5. The apparatus of claim 3, wherein the control circuit is further configured to increment the overvoltage event counter in response to the supply voltage sample signal exceeding the second overvoltage threshold and to increment another overvoltage event counter in response to the supply voltage sample signal exceeding the third overvoltage threshold.

6. The apparatus of claim 1, wherein the control circuit is further configured to:
compel the switch circuit into the conductive state in response to the supply voltage sample signal exceeding a first undervoltage threshold while the switch circuit is in the non-conductive state;
record an indication of an occurrence of an undervoltage event and control the switch circuit to remain in the conductive state in response to the supply voltage sample signal being below a second undervoltage threshold that is lower than the first undervoltage threshold while the switch circuit is in the conductive state; and
compel the switch circuit into the non-conductive state in response to the supply voltage signal being below a third undervoltage threshold that is lower than the second undervoltage threshold while the switch circuit is in the conductive state.

7. The apparatus of claim 6, wherein the control circuit is further configured to record the indication of the occurrence of the undervoltage event only once in response to any occurrence of the supply voltage sample signal falling below the second undervoltage threshold that precedes a rising of the supply voltage signal from below the second undervoltage threshold to exceed the first undervoltage threshold.

8. The apparatus of claim 6, wherein the control circuit is further configured to record an indication of the occurrence of another undervoltage event in response to the supply voltage sample signal being below the third undervoltage threshold while the switch circuit is in the conductive state.

9. The apparatus of claim 8, wherein the control circuit records the indication of the occurrence of the undervoltage event or the other undervoltage event by incrementing an undervoltage event counter.

10. The apparatus of claim 8, wherein the control circuit is further configured to record an indication of a time at which the undervoltage event or the other undervoltage event occurred.

11. The apparatus of claim 8, wherein the control circuit is further configured to increment the undervoltage event counter in response to the supply voltage sample signal falling below the second undervoltage threshold and to increment another undervoltage event counter in response to the supply voltage sample signal falling below the third undervoltage threshold.

12. The apparatus of claim 1, wherein the control circuit is further configured to record the indication of the occurrence of the overvoltage event only once in response to any occurrence of the supply voltage sample signal exceeding the second overvoltage threshold that precedes a falling of the supply voltage signal from exceeding the second overvoltage threshold to below the first overvoltage threshold.

13. A method of monitoring voltage conditions of an AC power supply with a power distribution apparatus comprising a switch circuit to selectively couple input circuitry connectable to the AC power supply by an input conductor to output circuitry connectable to a load through an overcurrent device by an output conductor, the switch circuit being controllable into a conductive state, where the input conductor is electrically connected to the output conductor through the switch circuit, and controllable into a non-conductive state, where the input conductor is electrically disconnected from the output conductor by the switch circuit, the method comprising:
generating a supply voltage sample signal representative of a voltage of the AC power supply;
compelling the switch circuit into the conductive state in response to the supply voltage sample signal being below a first overvoltage threshold while the switch circuit is in the non-conductive state;
recording an indication of an occurrence of an overvoltage event and compelling the switch circuit to remain in the conductive state in response to the supply voltage sample signal exceeding a second overvoltage threshold that is higher than the first overvoltage threshold while the switch circuit is in the conductive state; and
compelling the switch circuit into the non-conductive state in response to the supply voltage sample signal exceeding a third overvoltage threshold that is higher than the second overvoltage threshold while the switch circuit is in the conductive state.

14. The method of claim 13, further comprising:
recording an indication of an occurrence of another overvoltage event in response to the supply voltage sample signal exceeding the third overvoltage threshold while the switch circuit is in the conductive state.

15. The method of claim 14, wherein recording the indication of the occurrence of the overvoltage event or the other overvoltage event includes incrementing an overvoltage event counter and recording an indication of a time at which the overvoltage event or the other overvoltage event occurred.

16. The method of claim 13, further comprising:
compelling the switch circuit into the conductive state in response to the supply voltage sample signal exceeding a first undervoltage threshold while the switch circuit is in the non-conductive state;
recording an indication of an occurrence of an undervoltage event and compelling the switch circuit to remain in the conductive state in response to the supply voltage signal being below a second undervoltage threshold that is lower than the first undervoltage threshold while the switch circuit is in the conductive state; and
compelling the switch circuit into the non-conductive state in response to the supply voltage sample signal being below a third undervoltage threshold that is lower than the second undervoltage threshold while the switch circuit is in the conductive state.

17. The method of claim 16, further comprising:
recording an indication of an occurrence of another undervoltage event in response to the supply voltage sample signal being below the third undervoltage threshold while the switch circuit is in the conductive state.

18. The method of claim 17, wherein recording the indication of the occurrence of the undervoltage event or the other undervoltage event includes incrementing an undervoltage event counter and recording an indication of a time at which the undervoltage event or the other undervoltage event occurred.

19. A non-transitory computer readable medium encoded with software comprising computer executable instructions that, when executed by a processor, cause the processor to perform functions of:
comparing a supply voltage sample signal representative of a voltage of an AC power supply to a plurality of overvoltage thresholds;
compelling a switch circuit from a non-conductive state into a conductive state in response to the supply voltage sample signal being below a first overvoltage threshold such that an input conductor connectable to the AC power supply is electrically connected through the switch circuit to an output conductor connectable to a load through an overcurrent protection device;
recording an indication of an occurrence of an overvoltage event and compelling the switch circuit to remain in the conductive state in response to the supply voltage sample signal exceeding a second overvoltage threshold that is higher than the first overvoltage threshold; and
compelling the switch circuit from the conductive state into the non-conductive state in response to the supply voltage sample signal exceeding a third overvoltage threshold that is higher than the second overvoltage threshold such that the input conductor is electrically disconnected from the output conductor by the switch.

20. The non-transitory computer readable medium of claim 19, encoded with software comprising further computer executable instructions that, when executed by the processor, cause the processor to perform the further functions of:
comparing the supply voltage sample signal to a plurality of undervoltage thresholds;
compelling the switch circuit from the non-conductive state into the conductive state in response to the supply voltage sample signal exceeding a first undervoltage threshold;
recording an indication of an occurrence of another undervoltage event and compelling the switch circuit to remain in the conductive state in response to the supply voltage sample signal being below a second undervoltage threshold that is lower than the first undervoltage threshold; and
compelling the switch circuit from the conductive state into the non-conductive state in response to the supply voltage sample signal being below a third undervoltage threshold that is lower than the second undervoltage threshold.

* * * * *